Figure 1:
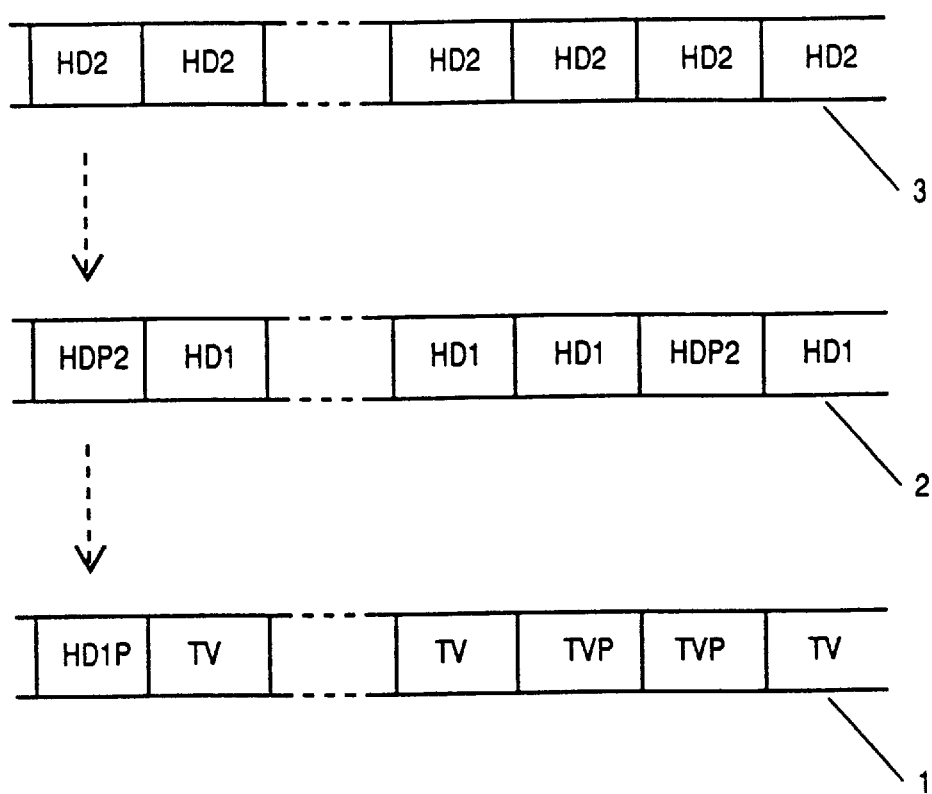

United States Patent [19]
Adolph et al.

[11] Patent Number: 5,825,430
[45] Date of Patent: Oct. 20, 1998

[54] METHOD, ENCODER AND DECODER FOR THE TRANSMISSION OF DIGITAL SIGNALS WHICH ARE HIERARCHICALLY STRUCTURED INTO A PLURALITY OF PARTS

[75] Inventors: Dirk Adolph, Ronnenberg; Carsten Herpel, Hannover, both of Germany

[73] Assignee: Deutsche Thomson Brandt GmbH, Villingen-Schwenningen, Germany

[21] Appl. No.: 763,560

[22] Filed: Dec. 10, 1996

[30]     Foreign Application Priority Data

Dec. 20, 1995 [DE] Germany .................. 195 47 707.3

[51] Int. Cl.[6] .............. H04N 7/12; H04N 11/02; H04N 11/04
[52] U.S. Cl. .............. 348/487; 348/426; 348/432; 370/465; 370/538; 375/260
[58] Field of Search ............... 348/423, 437, 348/384, 473, 487, 488; 375/39, 59, 260; 370/465, 468, 477, 474, 522, 538; H04N 7/12, 11/02, 11/04

[56]             References Cited
         U.S. PATENT DOCUMENTS 5,105,442  4/1992  Wei ............................................. 375/39
5,148,272  9/1992  Acampora et al. ..................... 358/133
5,243,629  9/1993  Wei .............................................. 375/59
5,287,178  2/1994  Acampora et al. ..................... 348/384
5,361,097  11/1994  Kolczynski ............................. 348/437
5,463,641  10/1995  Dorward et al. ........................ 371/374
5,467,132  11/1995  Fazel et al. ............................. 348/432

*Primary Examiner*—Tommy P. Chin
*Assistant Examiner*—Nhon T. Diep
*Attorney, Agent, or Firm*—Joseph S. Tripoli; Frederick A. Wein

[57]                ABSTRACT

A method and apparatus for the transmission of digital signals comprises the steps of forming at least two data channels carrying data packets, and eventually header data. The channels have different levels of error protection and include picture data, wherein the data packets within one of the channels have the same level of error protection, and wherein a super-ordinate channel has a higher error protection than a subordinate channel. Important information of a subordinate channel is then transmitted in a super-ordinate channel. The important information allows following erroneous reception of the digital signals an improved recovery of picture data decoding.

10 Claims, 4 Drawing Sheets

METHOD, ENCODER AND DECODER FOR THE TRANSMISSION OF DIGITAL SIGNALS WHICH ARE HIERARCHICALLY STRUCTURED INTO A PLURALITY OF PARTS

The invention relates to a method, an encoder and a decoder for the transmission of digital signals which are hierarchically structured into a plurality of parts, in particular for the hierarchical terrestrial transmission of digital television signals.

PRIOR ART

Digital transmission methods have an abrupt response, particularly in terrestrial channels. As long as the received field strength permits virtually error-free decoding of the digital data stream, a constantly good signal quality is present. However, if the field strength falls below a minimum, then the result is an abrupt increase in the bit errors and, in the extreme case, complete failure of the programme to be received. In order to prevent this behaviour, important signal components such as, for example, the coarse structures of a picture are provided with higher error protection, that is to say a data hierarchy is introduced. Video signals comprising important and less important picture components are produced in this way, with the result that, in the event of the less important components being lost, the picture can at least still be decoded and displayed with less quality.

Such hierarchical source coding is also employed in the context of the German associative project Hierarchical Digital Television Transmission (HDTVT) for HDTV programmes as well as the associated audio signals and supplementary information items, three-layer coding of the video signal being effected. Only a video signal with TV definition is transmitted in the subchannel 1 having the best protection, an HDTV signal with reduced quality (HD1) in the subchannel 2 and finally, in the subchannel 3 having the weakest protection, the residual information, which, when all three signals are decoded, then gives the HDTV signal with complete quality (HD2). This ensures that the reception of the HDTV signal does not abruptly break off in the event of the transmission signal becoming weaker, but rather first of all becomes worse in two stages. Nevertheless, even with a low error rate of the respective subchannel, the loss of particularly important information items in the video signal can lead to picture failure and, due to the prediction which is customarily employed in video coding, to errors which are visible for a relatively long time.

INVENTION

The invention is based on the object of specifying a method for the hierarchical transmission of digital signals in which higher error protection is provided for the particularly important information items in the video signal, in order, in particular, to reduce the perceptibility of errors and picture failures during the terrestrial reception of the signals. This object is achieved by means of the method specified in claim 1.

The invention is based on the further object of specifying an encoder and decoder for the application of the method according to the invention. This object is achieved by means of the encoder specified in claim 7 and by means of the decoder specified in claim 9.

The loss of sequence or picture header information items in a video signal can have the result that the succeeding picture cannot be decoded. This can have a highly disturbing effect even with a low error rate since, due to the temporal prediction in video coding, such as is effected, for example, in accordance with the MPEG2 standard, such an error can remain visible until the next intraframe-coded picture, that is to say for at most about ½ second. Special protection of the said header information items can eliminate these errors which are visible for a relatively long time.

According to the invention, therefore, in the context of hierarchical transmission in a plurality of subchannels, the most important information items in a video subchannel, in particular the respective header information items, are transmitted in a subchannel having higher error protection.

In principle, the inventive method for the transmission of digital signals, which are hierarchically structured into a plurality of parts, in associated subchannels, the superordinate channels having higher error protection than the subchannels which are subordinate to them, consists in the fact that part of the digital signals which logically belong to one of the subordinate subchannels are transmitted in at least one superordinate subchannel.

In this case, it is possible to transmit digital video signals which ensure a specific picture quality in the subchannel having the highest error protection and to transmit additional data, which in each case permit an improvement in the picture quality, in the subordinate subchannels, the headers for the video data which are transmitted in the subchannel which is arranged highest in the hierarchy advantageously experiencing better error protection by being transmitted several times in the same subchannel.

The respective parts of the digital signals which are not transmitted in the associated subchannel but in a superordinate channel preferably contain the headers of the video data for this signal part.

It is particularly advantageous here to transmit the respective parts of the digital signals which are not transmitted in the associated subchannel but in a superordinate channel in each case in the directly superordinate subchannel.

If the transmission is effected in accordance with the MPEG2 system multiplex, then it is furthermore advantageous to mark the transport packets containing the header information items by setting a priority bit.

In principle, the encoder according to the invention consists in the fact that hierarchical coding into a plurality of partial signals takes place in source coders, the data of the partial signals are combined in a multiplexer to form a data stream and the data stream is divided, in a channel interface, between a plurality of subchannels having different error protection, in such a way that part of the digital signals which logically belong to one of the subordinate subchannels are transmitted in at least one superordinate subchannel.

The transport packets in which header information items are transmitted are advantageously identified here in the multiplexer.

In principle, the decoder according to the invention consists in the fact that the signals of a plurality of subchannels having different error protection are combined to form a data stream in a channel interface. The data are subsequently split again into a plurality of partial signals in a demultiplexer, part of the digital signals which logically belong to one of the subordinate subchannels being transferred from at least one superordinate subchannel back into said subordinate subchannel and being decoded in source decoders to form video signals.

An encoder-site identification of the transport packets in which header information items are transmitted is advantageously evaluated here in the demultiplexer.

DRAWINGS

Figure 2:
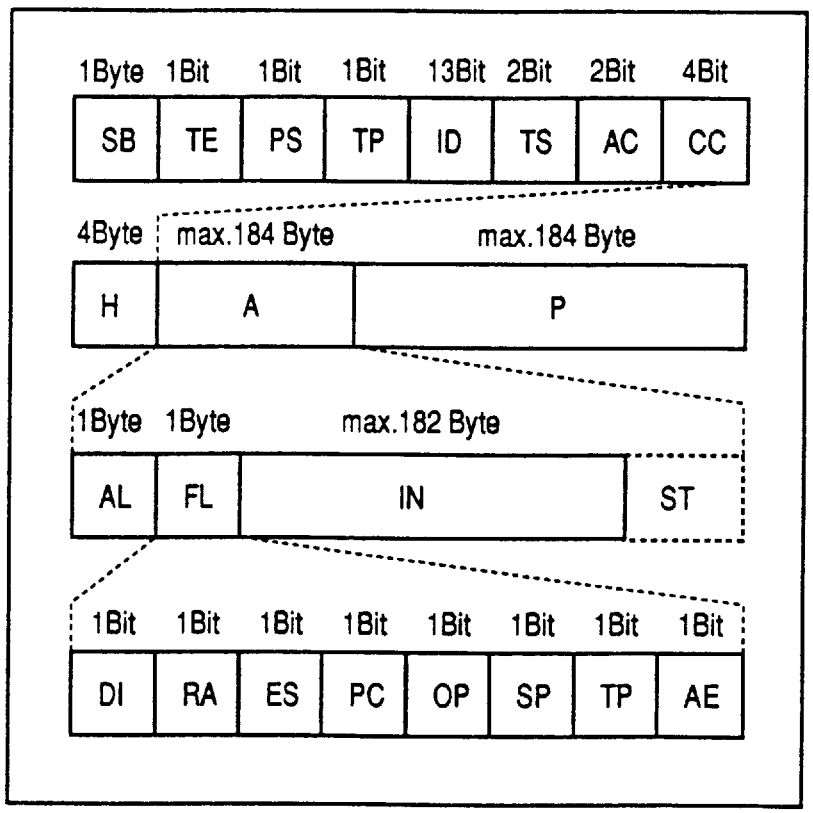
Figure 3:
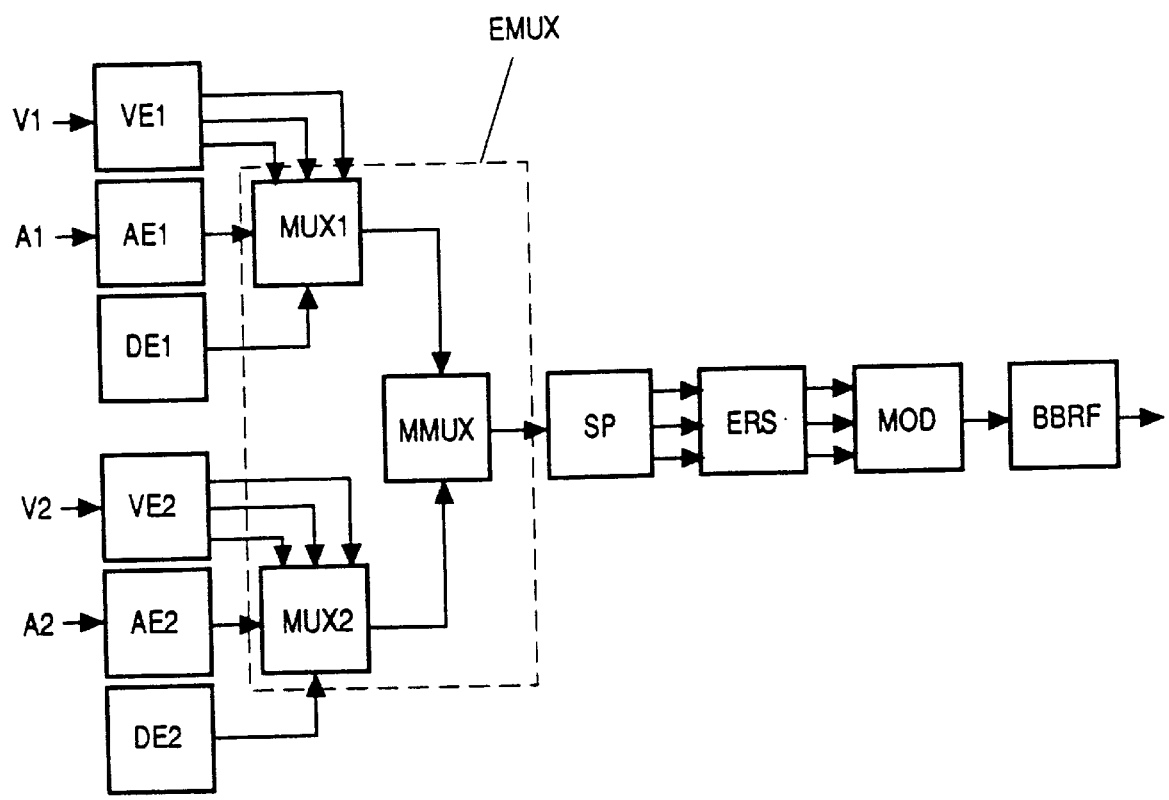
Figure 4:
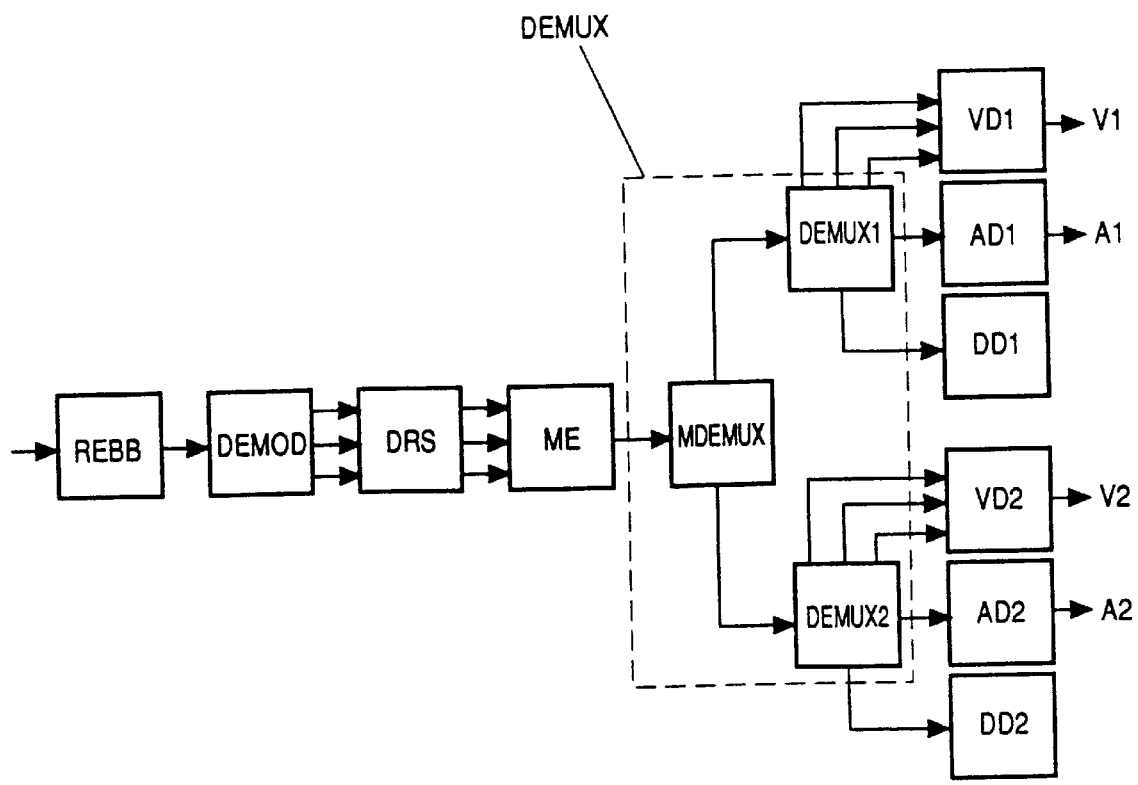

Exemplary embodiments of the invention are described with reference to the drawings, in which:

FIG. 1 shows hierarchical transmission according to the invention with three video subchannels, FIG. 2 shows the structure of a transport packet structure, FIG. 3 shows the block diagram of a transmitter for the transmission according to the invention, FIG. 4 shows the block diagram of a receiver for the reception of signals transmitted according to the invention.

EXEMPLARY EMBODIMENTS

FIG. 1 diagrammatically illustrates the inventive division of the video data between three (virtual) subchannels having different error protection (Channel 1: highest error protection, Channel 2: medium error protection, Channel 3: lowest error protection). Transmission channel 3 is used only for the video signals HD2 of the HD2 data stream. The header information items of the HD2 data stream HD2P are transmitted together with the video signals of the HD1 data stream HD1 in the better protected transmission channel 2. The header information items of the HD1 data stream HD1P are in turn transmitted in the best protected transmission channel 1. There is also effected in this subchannel the transmission of the video signals with only normal TV-definition TV and, to be precise, including the associated header information items TVP in the case of the HDTVT system. Additional protection of these headers can be achieved, on the one hand, by providing a further subchannel having better error protection and, on the other hand, it is possible, for example in the context of the MPEG2 system specification, to transmit packets repeatedly one after the other, as is likewise indicated in FIG. 1.

The hierarchical transmission described ensures that the headers of the HD2 data stream only become erroneous when the remainder of the HD2 data stream has almost completely failed. This applies analogously to the HD1 data stream and, if appropriate, also to the TV data stream.

The actual transmission of digital video data is preferably carried out in so-called transport packets. FIG. 2 shows the structure of a transport packet of the kind that is specified in the MPEG2 system specification and is to be employed for HDTVT. The transport packet has a fixed length of 188 bytes, 4 bytes being allotted to the header H of the transport packet. The remaining 184 bytes can be divided as desired into a region for the transmission of the useful information P (payload) and a region for the transmission of additional check and control information items A (adaptation field).

The header in this case contains the following bits, the respective functions of which emerge from the MPEG specification: a sync_byte SB, a transport_error_indicator bit TE, a payload_unit_start_indicator bit PS, a transport_priority bit TP, packet_identification bits ID, transport_scrambling_control bit TS, adaptation_field_control bits AC, as well as continuity_counter bits CC.

The adaptation field already mentioned can be used for further control information items, but it does not have to be used. The length of the adaptation field is transmitted in an adaptation_field_length byte AL, and this is followed by a further byte FL comprising eight individual check bits DI, RA, ES, PC, OP, SP, TP, AE. Following these, the actual information data IN are transmitted, as well as stuffing bytes ST, if necessary.

The important header information items of the video data stream (sequence or picture headers) comprise, as can be estimated from the MPEG2 video specification, at most approximately 180 bytes. This therefore corresponds approximately to the payload of a transport packet, it thereby being possible to use this to transmit the header information items.

Those transport packets which contain, as useful information, the header information items from one or more of the subchannels, can be identified by setting the transport priority bit TP transmitted in the header of the transport packet. Using this bit, it is possible to assign a different priority to transport packets during transmission, but evaluation has not to date been provided in the MPEG2 and HDTVT specifications.

On average, at a frame frequency of 25 Hz, the number of transport packets to be identified per second turns out to be approximately $(25+2)*2$ transport packets to be identified per second (approximately 81,000 bit/s), since approximately two sequence headers, which contain information items for random access to the data stream, are transmitted per second in addition to the video data. In the transmission channel 1, therefore, approximately 1.3% of the data rate available for the TV partial data stream is allocated for the priority packets of the HD1 stream, which entails an imperceptible deterioration in the TV signal. This apparent disadvantage is outweighed by the fact that under reception conditions where a certain error rate (for example $10^{-3}$) already exists in the channel 2, relatively lengthy large-area picture disturbances in the HD1 signal due to header losses no longer occur.

FIG. 3 illustrates a block diagram of a transmitter for the transmission method according to the invention, two programmes being transmitted by way of example. Video and audio signals V1, A1, V2, A2 are each fed to a source coder VE1, AE1 and VE2, AE2, respectively. A common programme data stream is produced from the source-coded video and audio signals, together with supplementary data which are generated in a stage DE1 and DE2, respectively, in a programme multiplexer MUX1 and MUX2, respectively. The various (in the example of FIG. 3: two) programme data streams are then combined in a transport multiplexer MMUX to form a transport data stream in accordance with the MPEG2 system specification, the transport packets being identified on the basis of the packet identifiers. The priority bits are also set during the multiplex operation, since at this point in time it is known how the headers are distributed, as appropriate, between a plurality of transport packets. In accordance with the identifications by means of the packet identifiers and priority bits, the individual partial data streams are then distributed between three subchannels by the channel interface SP (called splitter in the case of the HDTVT system), in order to transmit the coded data in accordance with their importance in channels having a different error rate. The channel interface SP in this case assigns the packets to the three subchannels in the following manner:

| Packet identifier | Priority bit | Transmission channel |
|---|---|---|
| TV | set | 1 |
| TV | — | 1 |
| HD1 | set | 1 |
| HD1 | — | 2 |
| HD2 | set | 2 |
| HD2 | — | 3 |

The signals are then provided with external error protection by means of Reed-Solomon coding in a coder ERS. Convolutional coding for the purpose of internal error protection as well as digital modulation are effected in the succeeding encoder unit MOD. Finally, the baseband signals are converted in a succeeding modulator BBRF into a form suitable for transmission (by satellite, by cable, terrestrially).

FIG. 4 illustrates by way of example a block diagram of a receiver for signals transmitted according to the invention, once again, by way of example, for transmission of two programmes. The reciprocal processing steps of the encoder take place. The received signals are first of all converted back into baseband signals in a demodulator RFBB. Digital demodulation as well as convolutional decoding, for example Viterbi decoding, are carried out in the succeeding decoder unit DEMOD, and this is followed by a Reed-Solomon decoder DRS. In the channel interface ME (called merger in the case of HDTVT), a transport data stream is then produced in accordance with MPEG2 and divided by the demultiplexer MDEMUX into the various programme data streams. The demultiplexers DEMUX1 and DEMUX2 then divide the programme data streams in each case into video, audio and other data, which are subsequently processed further in the decoder units VD1, AD1; VD2, AD2 and DD1, DD2, respectively, and supply the output video data V1, V2 and the output audio data A1, A2.

Since the HDTVT decoder specification is not based on a fixed assignment of the video data streams to the subchannels, a data stream transmitted according to the invention can readily be decoded by evaluating the priority bit.

The invention can be used, for example, for digital television systems such as DVB or HDTV or in the magnetic recording of digital data.

We claim:

1. Method for the transmission of digital signals, comprising the following steps:
    forming at least two data channels each carrying data packets and eventually header data including priority information, the channels including picture data having different levels of error protection, wherein the data packets within a channel have the same level of error protection and wherein a superordinate channel has a higher error protection than a subordinate channel;
    transmitting priority information of a subordinate channel in a superordinate channel, that priority information allowing, following erroneous reception of said digital signals, an improved recovery of picture data decoding.

2. Method according to claim 1, wherein standard definition picture data are transmitted in a superordinate channel and improved definition picture data are transmitted in at least one subordinate channel.

3. Method according to claim 2, wherein said priority information of a subordinate channel comprises header data for picture data of said subordinate channel.

4. Method according to claim 3, wherein in the case of transmitting said digital signals in more than two channels, said priority information of a specific subordinate channel is in each case transmitted with respect to the level of error protection in the directly superordinate channel.

5. Method according to claim 4, wherein header data transmitted in the channel having the highest level of error protection are transmitted several times in said channel.

6. Method according to claim 5, wherein the transmission is effected in accordance with the MPEG2 system multiplex, the transport packets containing the header data being marked by setting a priority bit.

7. An encoder for encoding hierarchically transmitted digital signals in a plurality of subchannels, including superordinate subchannels having higher error protection than subchannels which are subordinate to said superordinate subchannels comprising;
    source coders for hierarchically coding said digital signals into a plurality of partial signals comprising data packets, header data, and picture data;
    a multiplexer for combining data of said partial signals to form a data stream;
    means for dividing said data stream into said plurality of subchannels each having different error protection in a channel interface, wherein part of said digital signals which logically belong to one of said subordinate subchannels including header data and picture data are transmitted in at least one of said superordinate subchannels.

8. The encoder according to claim 7, wherein transport packets in which header information items are transmitted, are identified by said multiplexer.

9. A decoder for decoding hierarchically transmitted digital signals in a plurality of subchannels comprising superordinate subchannels, having higher error protection than subchannels that are subordinate to said superordinate subchannels, comprising:
    channel interface means for combining said digital signals of said plurality of subchannels, each having different error protection levels to form a data stream;
    a de-multiplexer for splitting said data stream into a plurality of partial signals, wherein part of said digital signals including header data and picture data which logically belong to one of the subordinate subchannels are transferred from at least one superordinate subchannel back into said subordinate subchannel to form video signals.

10. The decoder according to claim 9, wherein said de-multiplexer is operative to evaluate encoder side identification of transport packets, in which header information items are transmitted.

* * * * *